US007935997B2

(12) United States Patent
McDaniel

(10) Patent No.: US 7,935,997 B2
(45) Date of Patent: May 3, 2011

(54) LOW RESISTANCE PERIPHERAL CONTACTS WHILE MAINTAINING DRAM ARRAY INTEGRITY

(75) Inventor: Terrence McDaniel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 382 days.

(21) Appl. No.: 11/612,588

(22) Filed: Dec. 19, 2006

(65) Prior Publication Data

US 2007/0158749 A1    Jul. 12, 2007

Related U.S. Application Data

(62) Division of application No. 11/074,563, filed on Mar. 8, 2005, now Pat. No. 7,445,996.

(51) Int. Cl.
*H01L 27/108* (2006.01)
(52) U.S. Cl. ............... 257/296; 257/383; 257/E21.646; 257/E27.084; 438/258; 438/682
(58) Field of Classification Search .......... 438/239–258, 438/390, 680, 682, 683, 685, 672, 675; 257/296, 257/300–306, 383, 763, 770, E21.646, E21.683, 257/E27.084
See application file for complete search history.

(56) References Cited

U.S. PATENT DOCUMENTS

| | | | |
|---|---|---|---|
| 5,674,773 A | 10/1997 | Koh et al. | |
| 5,837,577 A | 11/1998 | Cherng | |
| 5,893,734 A | 4/1999 | Jeng et al. | |
| 5,990,021 A | 11/1999 | Prall et al. | |
| 6,124,164 A | 9/2000 | Al-Shareef et al. | |
| 6,180,508 B1 | 1/2001 | Lowrey | |
| 6,455,424 B1 | 9/2002 | McTeer et al. | |
| 6,465,829 B2 * | 10/2002 | Takeda et al. | 257/300 |
| 6,524,912 B1 * | 2/2003 | Yang et al. | 438/258 |
| 6,528,888 B2 * | 3/2003 | Cho et al. | 257/775 |
| 6,580,115 B2 | 6/2003 | Agarwal | |
| 6,756,267 B2 | 6/2004 | Shimizu et al. | |
| 6,780,758 B1 | 8/2004 | Derderian et al. | |
| 6,784,501 B2 | 8/2004 | Lane et al. | |
| 2001/0005058 A1 | 6/2001 | Asano et al. | |
| 2001/0045665 A1 * | 11/2001 | Okumura | 257/774 |
| 2002/0042209 A1 | 4/2002 | Abe et al. | |
| 2006/0046398 A1 * | 3/2006 | McDaniel et al. | 438/279 |

OTHER PUBLICATIONS

Fazio, Al, et al., ETOX™ Flash Memory Technology; Scaling and Integration Challenges; Intel Technology Journal—Semiconductor Technology and Manufacturing; May 16, 2002; pp. 23-30; vol. 06; Issue 02.

(Continued)

*Primary Examiner* — Khiem D Nguyen
(74) *Attorney, Agent, or Firm* — Wells St. John, P.S.

(57) ABSTRACT

An apparatus having low resistance contacts in both the memory cell array and peripheral logic circuitry areas of a semiconductor device, for example, a DRAM memory device, is disclosed. In a buried bit line connection process flow, the present invention utilizes chemical vapor deposition of titanium to form titanium silicide in contact structures of the peripheral logic circuitry areas and physical vapor deposition to provide a metal mode (metallic) titanium layer in contact with the poly plugs in the memory cell array area of a semiconductor device, for example, a DRAM memory device according to the present invention. In this manner, the present invention avoids the potential drawbacks such as voiding in the poly plugs of the memory cell array due to the present of titanium silicide, which can cause significant reduction of device drain current and in extreme cases cause electrical discontinuity.

24 Claims, 14 Drawing Sheets

OTHER PUBLICATIONS

Tao, K., et al., Ionized Physical Vapor Deposition of Titanium Nitride: A Global Plasma Model; Journal of Applied Physics; Apr. 1, 2002; pp. 4040-4048; vol. 91; No. 7.

Mao, D., et al.; Ionized Physical Vapor Deposition of Titanium Nitride: Plasma and Film Characterization; J. Vac. Sci. Technol. A 20(2); Mar./Apr. 2002; pp. 379-387.

* cited by examiner

LOW RESISTANCE PERIPHERAL CONTACTS WHILE MAINTAINING DRAM ARRAY INTEGRITY

CROSS REFERENCE TO RELATED APPLICATIONS

This application is a division of U.S. patent application Ser. No. 11/074,563, filed Mar. 8, 2005, now issued as U.S. Pat. No. 7,445,996.

FIELD OF THE INVENTION

The present invention relates to the field of integrated circuits and, in particular, the use of low resistance peripheral contacts while maintaining memory cell array integrity of a memory device, such as dynamic random access memories (DRAMs).

BACKGROUND OF THE INVENTION

Complex integrated circuits, such as dynamic random access memories (DRAMs), have multiple levels of conductors above the surface of a silicon substrate that are used to interconnect various portions of a fabricated circuit. For DRAM devices, the doped regions or active area of a transistor fabricated in a substrate are typically contacted using polysilicon (poly) plugs, which may connect with a capacitor, a bit line, or other conductor layers. Metal contacts would provide better conductivity than poly plugs; however, metal contacts are typically not used to contact the doped regions of a substrate because of processing restraints including the heat sensitivity of a metal contact to later high temperature fabrication processes and possible active area contamination caused by metal diffusing into the active area of the substrate.

In DRAM devices, heat cycles are often used to anneal capacitor structures formed after formulation of the substrate contacts, which would melt the metal and cause the metal to diffuse into the substrate and thereby contaminate the active area and ruin conductivity between the contact and the substrate. Nevertheless, because of its better conductive properties, it is preferable, if at least some of the contacts to the substrate surface were made of metal instead of polysilicon.

One method of increasing conductivity involves the deposition of a thin titanium film, over the wafer so that it covers the enhanced region at the bottom of the contact opening prior to deposition of additional conductive layers. However, as contact structures, such as trenches, contact openings, and vias, are made smaller, they become more difficult to fill. To begin to appreciate this problem, it should be understood that the lateral dimension of such structures is typically referred to as the "width" and the vertical dimension of such structures is typically referred to as the "depth." The aspect ratio is the ratio of depth to width. Thus, as the features have become smaller, the aspect ratio has risen, resulting in high aspect structures, which as mentioned above, become more difficult to fill void-free, and preferably seam-free, with an appropriate material. Accordingly, many different techniques have been developed in an effort to address this problem. For example, films may be deposited by several different methods, such as spin-on deposition, chemical vapor deposition (CVD), plasma enhanced chemical vapor deposition (PECVD), and physical deposition.

Of the methods mentioned above, it is arguable that CVD and PECVD are best suited to deposit the thinnest films in high aspect ration contact structures. However, utilizing CVD or PECVD in order to provide a titanium film layer in the high aspect ratio contact structures in the peripheral circuit logic area at the processing level for forming bit line connections when typically doped polysilicon (poly) plugs in the memory cell array area are exposed, thereby contacting CVD titanium with the poly plugs, is problematic. Through subsequent heat cycles, titanium in the film layer covering the poly plugs will migrate into the doped poly plug and form titanium silicide. The formation of titanium silicide, however, causes voids to form in the poly plugs and titanium layer due to the respective volume changes, which can cause significant reduction of device drain current and in extreme cases cause electrical discontinuity. Additionally, titanium silicide formation will also cause dry etch issues in subsequent processing steps as the titanium silicide will etch faster than the poly plug, cause undercutting and lifting of laid lines. As a result, using a titanium layer deposited by chemical vapor deposition, which can make low resistance contacts, is excluded during the buried bit line connection process flow due to the above mentioned potential drawbacks.

SUMMARY OF THE INVENTION

It is against the above background that the present invention provides a method and apparatus directed to forming low resistance contacts in both memory cell array and peripheral logic circuitry areas of a semiconductor device, for example, a DRAM device, which provides a number of advancements and advantages over the prior art. In a buried bit line connection process flow, the present invention utilizes chemically vapor deposition of titanium to form a titanium/titanium silicide layer in the contacts of the peripheral logic circuitry areas, and physical vapor deposition to provide a metal mode (metallic) titanium layer contacting the poly plugs in the memory cell array areas of a semiconductor device according to the present invention. When the layers are annealed at temperatures above 650° C. in subsequent heat cycles, titanium silicide is only formed in the peripheral logic circuitry areas as the metal mode titanium layer in contact with the poly plugs provides a suitable thermal barrier as nitrogen is denuded from an overlaying tungsten nitride film and ties up dangling bonds in the metal mode titanium layer, so less titanium reacts with the poly plus, thereby forming insignificant amounts of titanium silicide. In this manner, the present invention avoids the potential drawbacks such as voiding in the poly plugs of the memory cell array due to the presence of titanium and subsequent volume change due to titanium silicide formation, which can cause significant reduction of device drain current and in extreme cases cause electrical discontinuity.

In one embodiment, a method of forming a memory device is disclosed. The method comprises providing a substrate having a memory cell array area and a peripheral circuitry area, wherein said memory cell array area comprises at least one polysilicon plug; providing an insulating layer over said substrate; defining at least one periphery contact opening in material layers over said substrate at said periphery circuitry area of said substrate, wherein said material layers is at least said insulating layer, and said at least one periphery contact opening exposes said substrate; forming a titanium film layer over said insulating layer and into said at least one periphery contact opening to contact said substrate and form titanium silicide; defining at least one memory cell array contact in said material layers over said substrate at said memory cell array area of said substrate, said at least one memory cell array contact opening exposes said at least one polysilicon plug; and forming a metal mode (metallic) titanium film layer over said substrate and into said at least one memory cell array contact opening to contact said at least one polysilicon plug.

These and other features and advantages of the invention will be more fully understood from the following description of various embodiments of the invention taken together with the accompanying drawings.

BRIEF DESCRIPTION OF THE DRAWINGS

The following detailed description of the embodiments of the present invention can be best understood when read in conjunction with the following drawings, where like structure is indicated with like reference numerals and in which.

DETAILED DESCRIPTION

Figure 1:
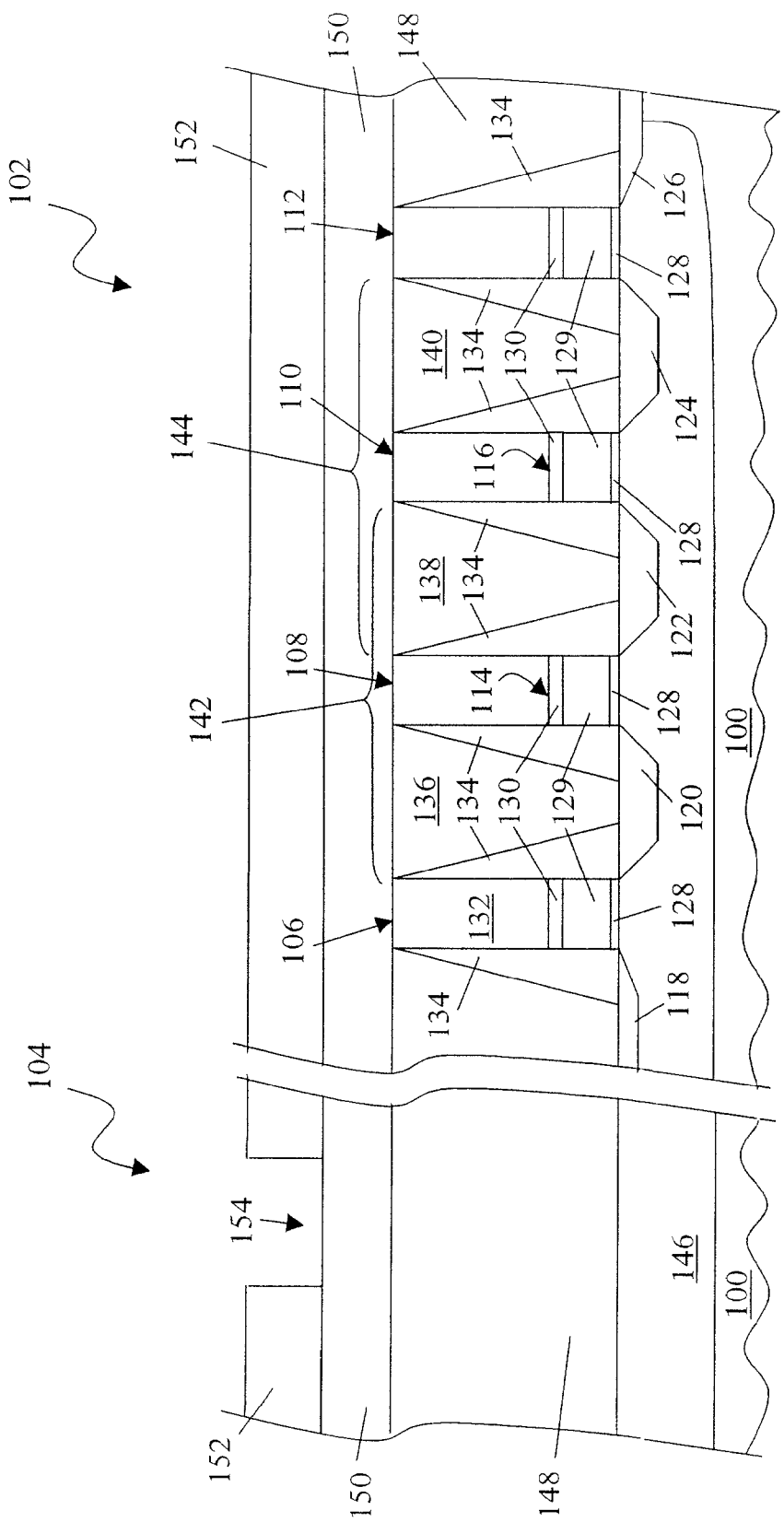
FIG. 1 is a cross-sectional view of the early stages of fabrication of a semiconductor device in accordance with an exemplary embodiment of the present invention.

In the following detailed description, reference is made to various specific embodiments in which the invention may be practiced. These embodiments are described with sufficient detail to enable those skilled in the art to practice the invention, and it is to be understood that other embodiments may be employed, and that various structural, logical, and electrical changes may be made without departing from the spirit or scope of the invention. Additionally, well-known structures, processes, and materials associated with microelectronic device fabrication have not been shown in detail in order to avoid unnecessarily obscuring the description of the embodiments of the invention.

Furthermore, skilled artisans appreciate that elements in the figure are illustrated for simplicity and clarity and have not necessarily been drawn to scale. For example, the dimensions of some of the elements in the figure may be exaggerated relative to other elements to help to improve understanding of the various embodiments of the present invention.

The term "substrate" used in the following description may include any semiconductor-based structure that has an exposed substrate surface. Structure should be understood to include silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The present invention relates to forming, during a buried bit line connection process flow, low resistance contacts to a substrate in the peripheral circuit logic area and to poly plugs in the memory cell array area formed as part of a memory device, such as a DRAM memory device. The present invention will be described as set forth in an exemplary embodiment illustrated below. Other embodiments may be used and structural or logical changes may be made without departing from the spirit or the scope of the present invention.

In accordance with the present invention, a method is provided for forming low resistance contacts for both N and P doped active regions in a peripheral logic circuitry area, which is typically formed outside of and around a memory cell array area. Referring now to the drawings, where like elements are designated by like reference numerals, FIGS. 1 through 14 illustrate exemplary embodiments of the fabrication steps and resulting structures in accordance with the present invention.

Referring to FIG. 1, on a substrate 100, a memory cell array indicated generally by reference numeral 102 and a peripheral circuitry area, indicated generally by reference numeral 104 are shown during an early stage of fabrication. The peripheral circuitry area 104 is typically either an N-channel transistor area or a P-channel transistor area. The memory cell array 102 includes gate stacks 106, 108, 110, 112, where in one embodiment, gate stacks 108 and 110 in the memory cell array comprise electrically isolated word lines 114, 116. Active areas are provided about the gate stacks 106, 108, 110, 112, such as the doped active areas 120, 122, 124 that form Field Effect Transistors (FETs) provided between field isolation areas 118, 126.

Each of the gate stacks 106, 108, 110, 112 includes a layer of oxide 128, such as silicon dioxide in contact with the substrate, a layer of polysilicon 129 provided on the oxide, a conductive gate layer 130 provided on the poly, an insulating cap layer 132, and insulating sidewalls 134. Provided between the gate stacks 106, 108, 110, 112 are polysilicon (poly) plugs 136, 138, 140. The polysilicon (poly) plugs 136, 140 shown in FIG. 1 will connect with subsequently formed memory cell capacitors and poly plug 138 will connect with a subsequently formed bit line. Accordingly, gate stacks 108, 110 are part of access transistors 142, 144 for respective memory cells. Additionally, gate stacks 106, 112 formed part of other memory cells in a different cross-sectional plane from that illustrated, which are used for self-aligned fabrication processes, and field oxide regions 118, 126 are used to isolating the memory cells in the memory cell array 102.

A doped well 146 may be provided in the substrate 100 and associated with a respective memory cell array 102 and peripheral circuitry area 104. For the N-channel transistors, the doped well 146 is a p-well, while for the P-channel transistors the doped well is a n-well, as is well known in the art.

As further shown in FIG. 1, planarized first insulating layer 148, formed of, for example, borophosphosilicate glass (BPSG) or silicon dioxide has been formed over the gate stacks and active areas. The first insulating layer 148 is then planarized by chemical mechanical polishing (CMP) or other suitable means. A second insulating layer 150, formed of, for example, tetraethylorthosilicate (TEOS) or other oxide, is formed over the first insulating layer 148. The second insulating layer 150 is deposited with a thickness, for low resistance contacts of current integration size and levels, in a range of about 5 Angstroms to about 10,000 Angstroms. Of course, one skilled in the art will be able to easily vary the relevant dimensions to fit the particular application. If desired, the second insulating layer 150 may also by planarized by chemical mechanical polishing (CMP) or other suitable means; however, this step may be skipped as the first insulating layer 148 is planar. The structure shown in FIG. 1 serves as the starting foundation for the invention which is discussed hereafter.

Figure 2:
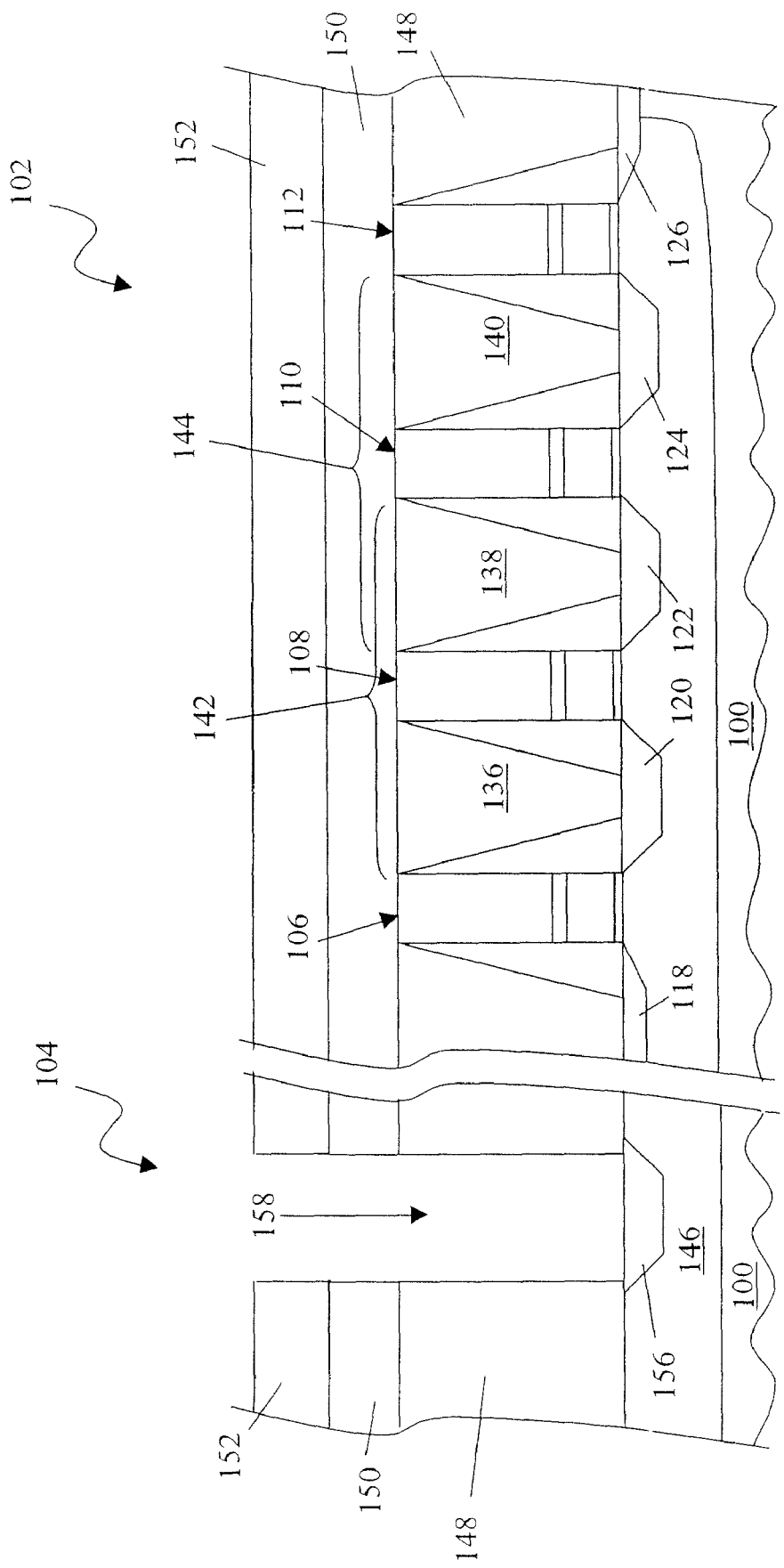
FIG. 2 shows the semiconductor device of FIG. 1 at a processing step subsequent to that shown in FIG. 1.

The process of the present invention begins by applying a photoresist mask 152 to the second insulating layer 150. Opening 154 in the mask defines an etch location of a peripheral contact to other wordlines and actives areas. As shown in FIG. 2, a first portion of the first and second insulating layers is removed by etching to expose, for example, an active area 156 which is N+ doped for N-channel transistors, and P+ doped for P-channel transistors. It is also possible to dope the active area 156 after the etching operation instead of doping such areas prior to etching. The contact opening 158 is thus provided, as shown in FIG. 2.

Figure 3:
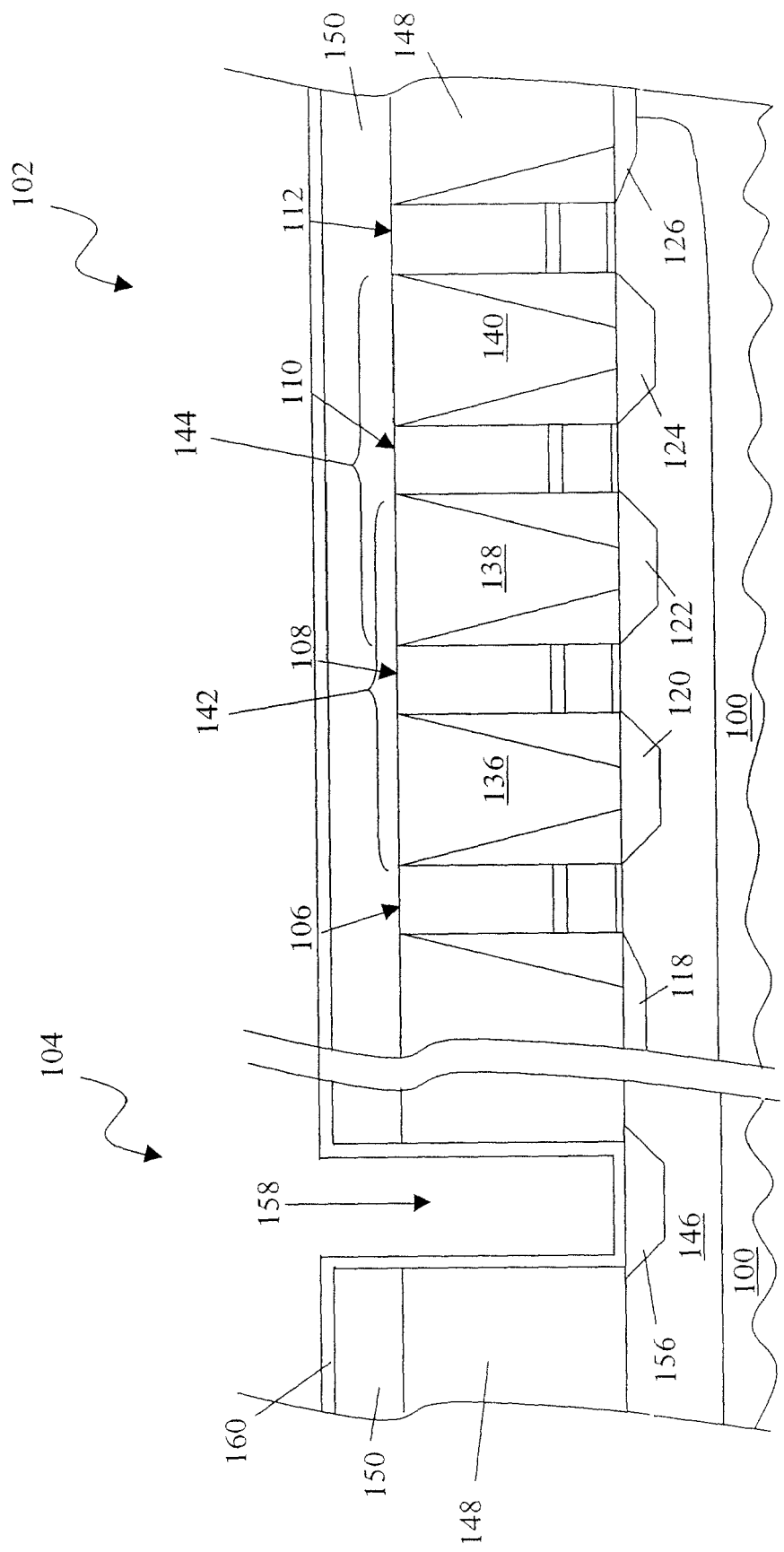
FIG. 3 shows the semiconductor device of FIG. 1 at a processing step subsequent to that shown in FIG. 2.

As shown by the structure illustrated in FIG. 3, after contact opening 158 is formed, such as by reactive ion etching (RIE), the photoresist mask 152 is removed and a low resistance metal film layer 160 is deposited by CVD over the second insulating layer 150. The metal film layer 160 is titanium which will cover the contact opening 158, and form titanium silicide ($TiSi_x$) in the peripheral circuitry area 104 in a subsequent heating cycle when the layers are annealed at temperatures above 650° C. The metal film layer 160 is deposited with a thickness in a range of about 1 Angstrom to about 5,000 Angstroms. As the second insulating layer 150 is intact over the memory cell array area 102, no CVD Ti comes into contact with poly plug 138, which will connect with a subsequently formed bit connection.

In another embodiment, $TiSi_x$ can be provided in the contact opening 158 by reacting chemically vapor deposited Ti with Si from the substrate 100 or with Si simultaneously added from the vapor phase. For example, the titanium silicide areas in the contact opening 158 may be formed by depositing Ti from the precursor TiCl4, with the Si coming from the substrate 100 or from added gas-phase $SiH_4$ or $SiH_2Cl_2$.

Figure 4:
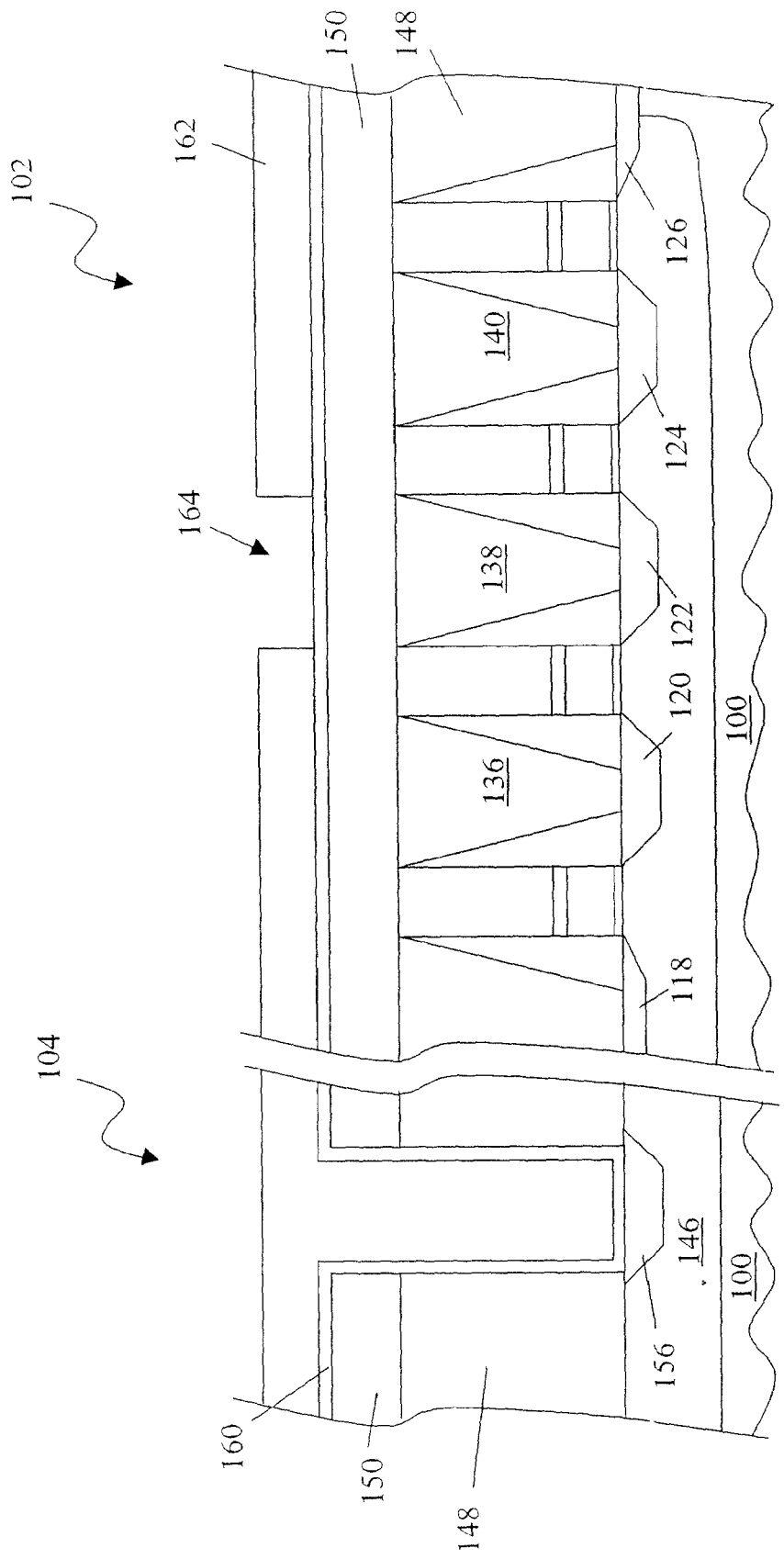
FIG. 4 shows the semiconductor device of FIG. 1 at a processing step subsequent to that shown in FIG. 3.
Figure 5:
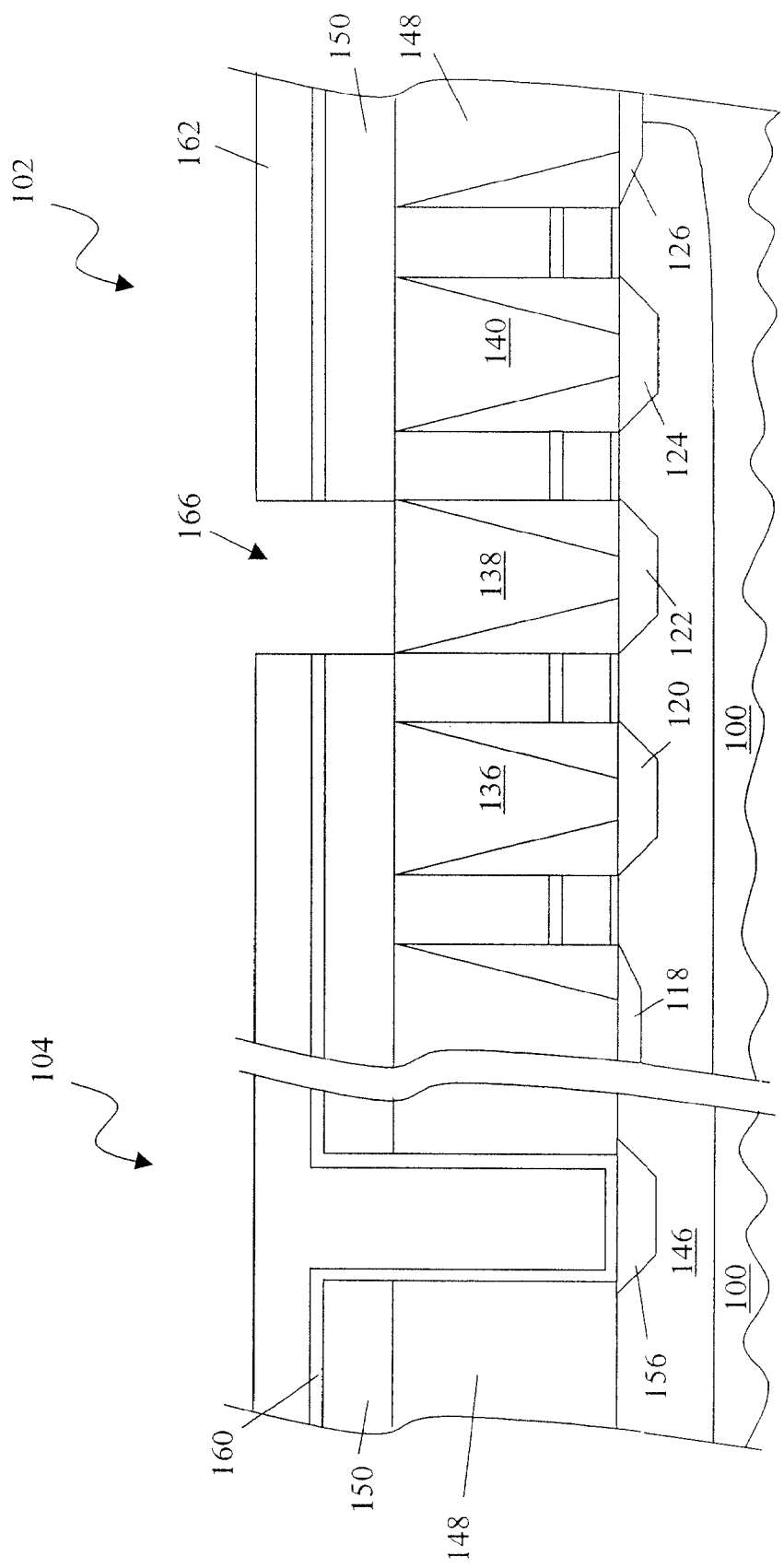
FIG. 5 shows the semiconductor device of FIG. 1 at a processing step subsequent to that shown in FIG. 4.

As illustrated by FIG. 4, after Ti deposition, a second photoresist mask 162 is provided over the Ti film layer 160 to a thickness standard in the art, and patterned to provide an opening 164 located over the memory cell array area 102, and in particular, poly plug 138. As shown by the structure illustrated in FIG. 5, bit connection opening 166 is formed by anisotropically etching through the first and second insulating layers 150, 160, thereby opening the bit connections in the memory cell array area 102. It is to be appreciated that the etching process to form the bit connection openings in the memory cell array area 102 can be one or more process steps (in-situ or ex-situ).

For example, in one embodiment, in a first part of the bit connection opening formation process, the Ti metal film layer 160 is anisotropically etched using a reactive halogen containing plasma etch process, such as chlorine, fluorine, and the like, which is very selective and stops at the first insulating layer 150. In a second part of the bit connection opening formation process, the first insulating layer 150 is then anisotropically etched using a reactive halogen containing plasma etch process to remove the portion of the first insulating layer 150 over the bit connections, thereby exposing the bit connection poly plugs, such as for example, poly plug 138.

Figure 6:
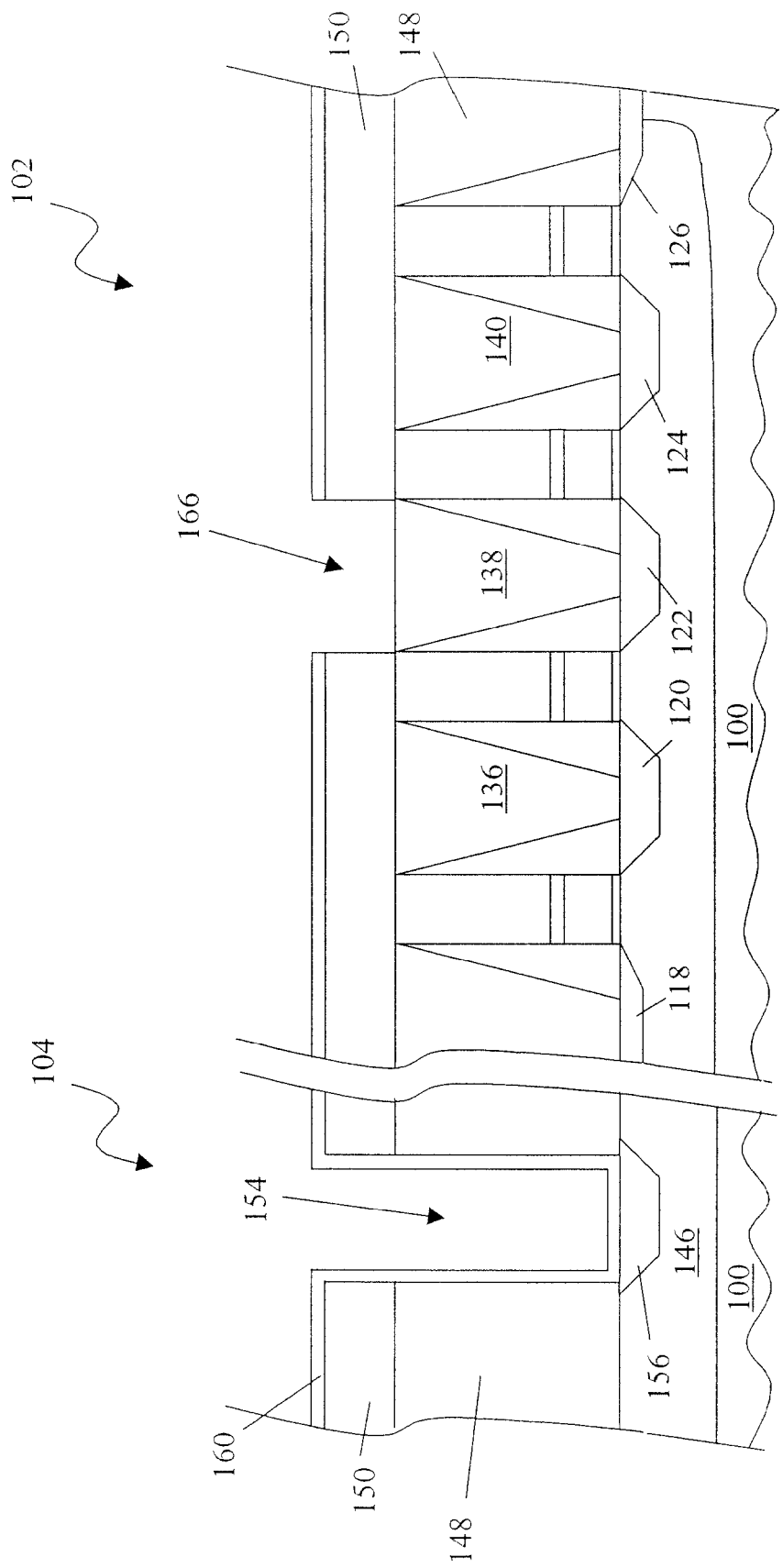
FIG. 6 shows the semiconductor device of FIG. 1 at a processing step subsequent to that shown in FIG. 5.
Figure 7:
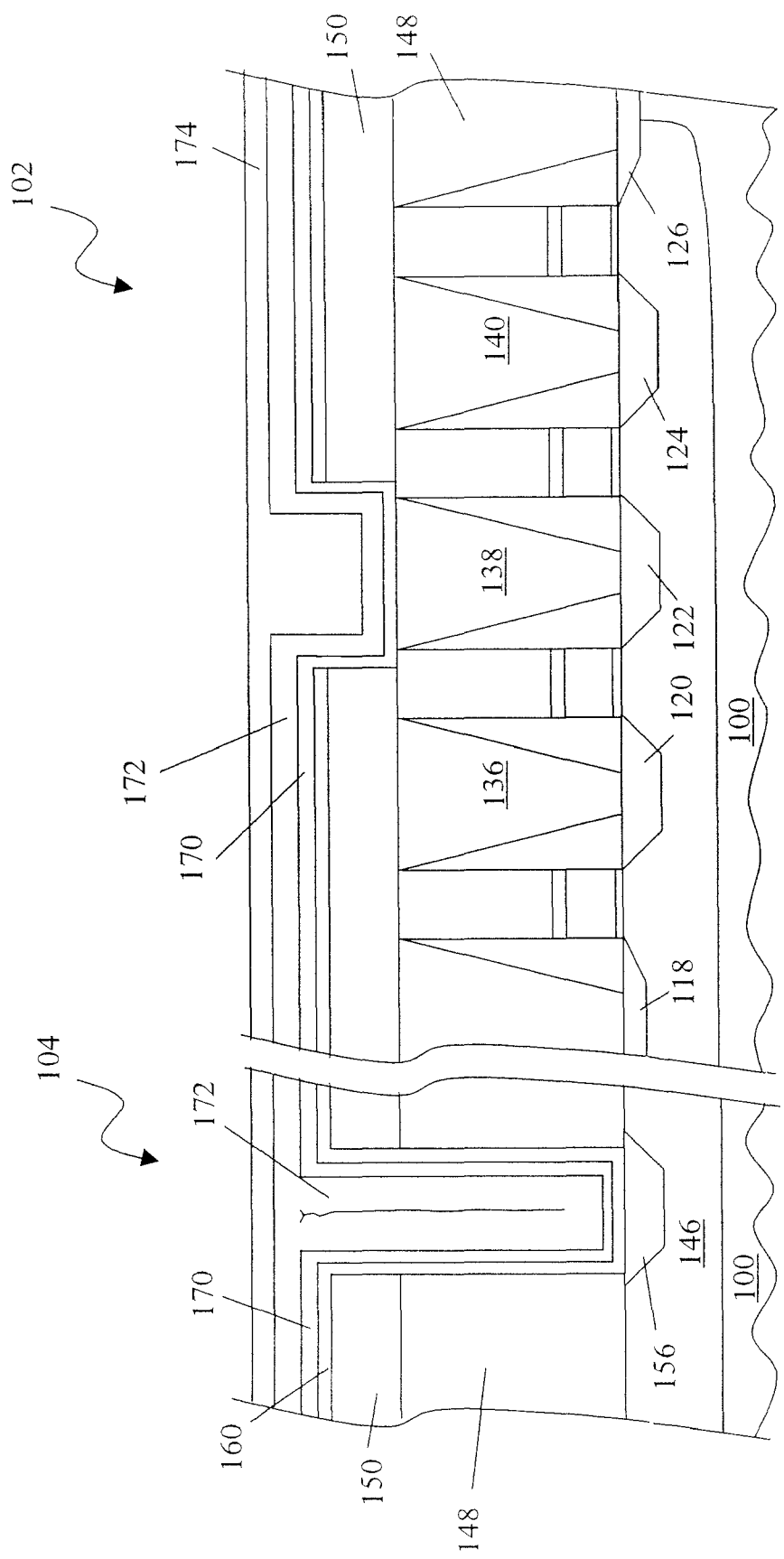
FIG. 7 shows the semiconductor device of FIG. 1 at a processing step subsequent to that shown in FIG. 6.

As shown by FIG. 6, the second photoresist mask 162 is stripped and then a standard metal deposition pre-clean step is performed. Referring now to FIG. 7, after the formation and cleaning of the contact opening 166, a low-resistivity metal mode titanium/tungsten nitride/tungsten (MMTI/WN/W) film stack is provided. First, a metal mode (metallic) titanium film layer 170 is deposited, using a physical vapor deposition (PVD) process, over the memory cell array and peripheral circuitry areas 102 and 104, respectively, which fills into the openings 154, 166 (FIG. 6). It is to be appreciated that the metal mode titanium film layer 170 does not form silicides or ultra thin silicides, thus providing good contact to the poly plug 138 without voiding. The metal mode titanium film layer 170 is deposited with a thickness in a range of about 1 Angstrom to about 5000 Angstroms.

Next, the WN/W layer 172 is deposited using either a PVD or CVD process, which completely fills the peripheral contact opening 154 and partially fills contact opening 166(FIG. 6). The WN/W film layer 172 is deposited with a thickness in a range of about 5 Angstroms to about 5000 Angstroms. Finally, a nitride capping layer 174 is deposited over the substrate filling completely the contact opening 166, and planarized to have a thickness in a range of about 100 Angstroms to about 10,000 Angstroms.

Figure 8:
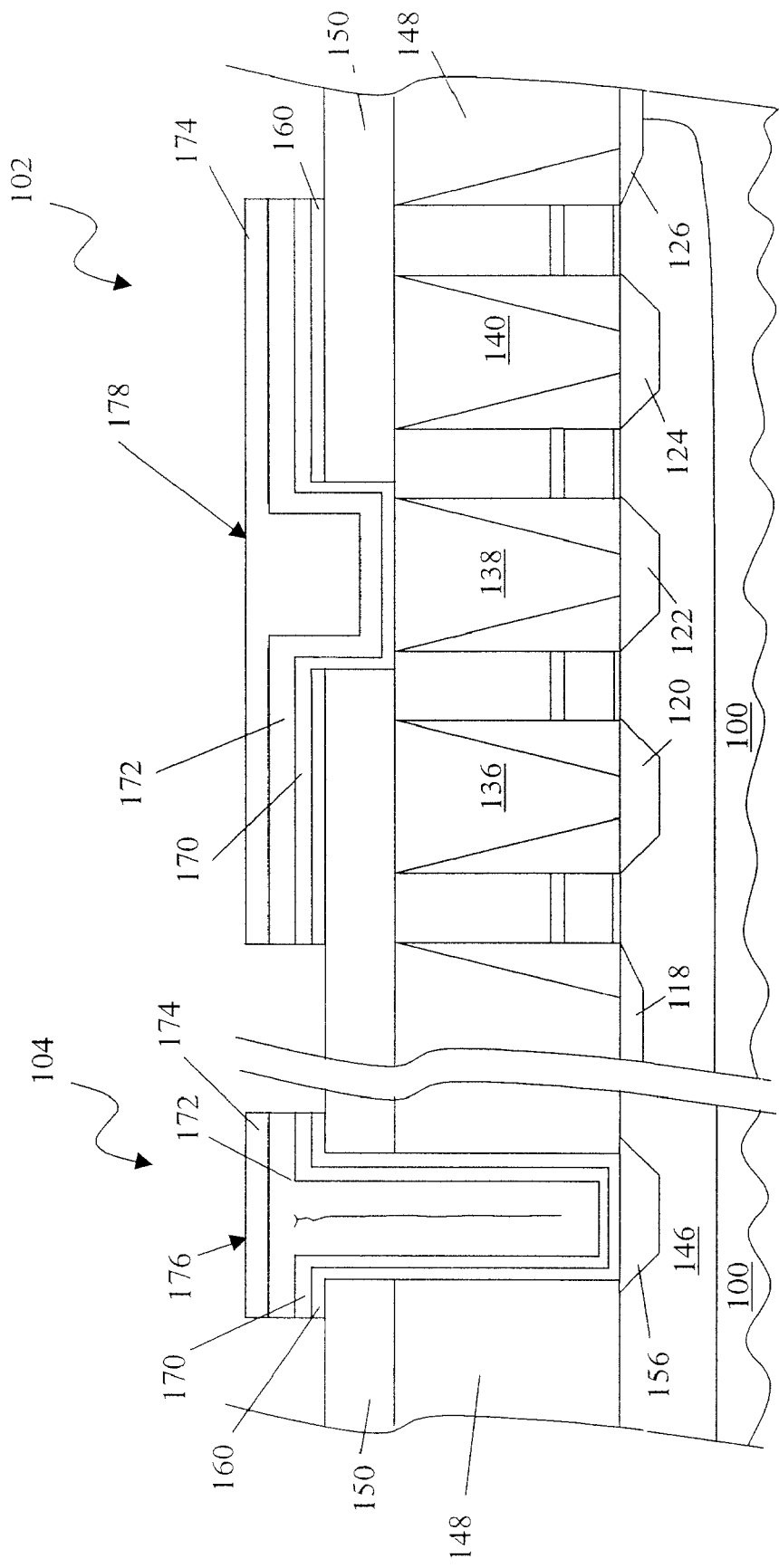
FIG. 8 shows the semiconductor device of FIG. 1 at a processing step subsequent to that shown in FIG. 7.

As shown in FIG. 8, a directional etching process or other suitable process is used to etch through a photoresist mask (not shown) to remove portions of layers 160, 170, 172, 174 in areas not desired and in order to form low resistance contacts 176, 178. The contacts 176, 178 may be of any suitable size and shape so as to provide a low resistance vertical path to the active areas 122, 146. The contacts, such as contact 176, in the peripheral circuitry area 104 are preferably of a smaller area than the contacts, such as contact 178, in the memory cell array area 102.

Figure 9:
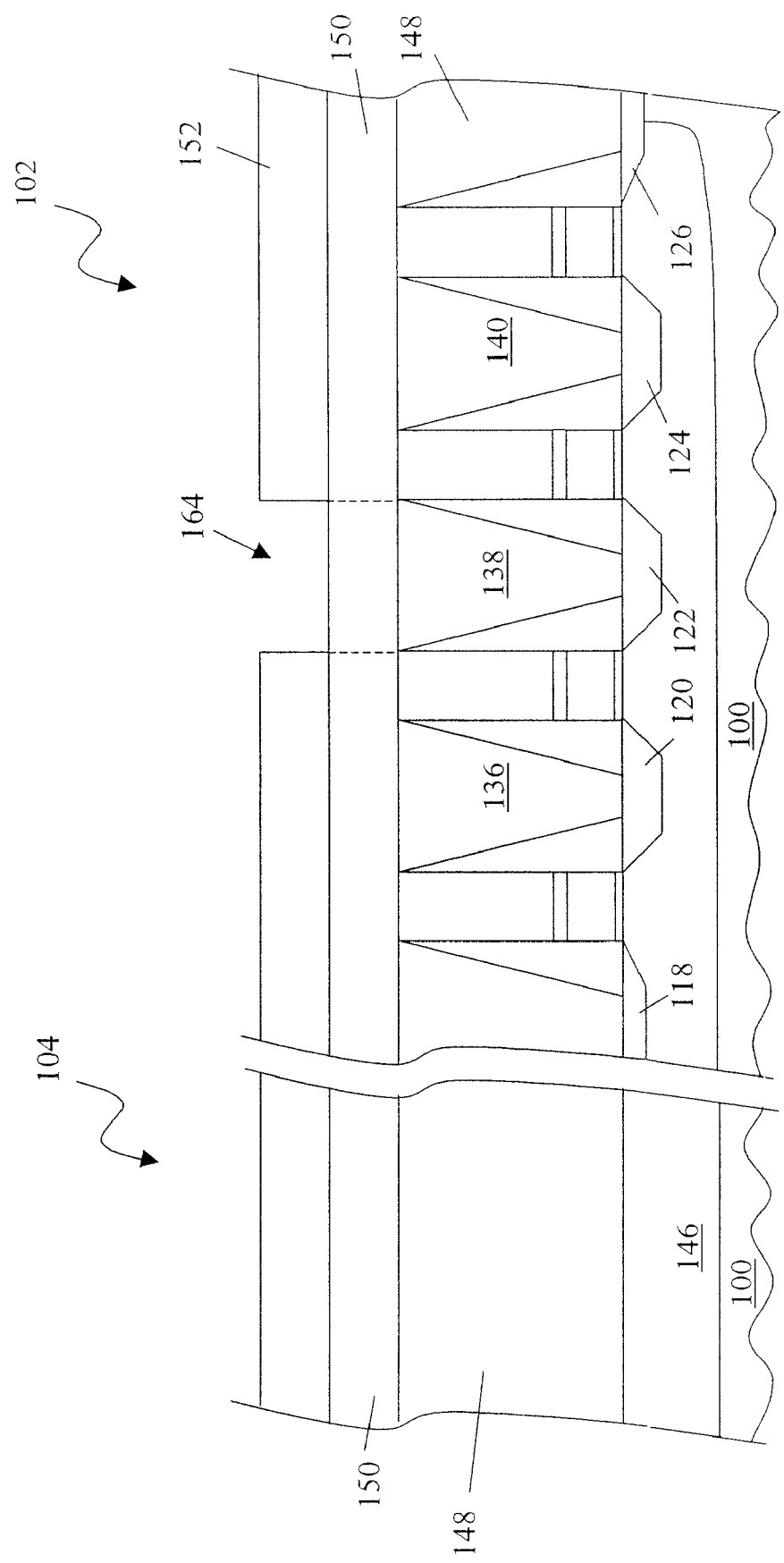
FIG. 9 shows the semiconductor device of FIG. 1 at a processing step according to an alternate embodiment of the present invention.

An alternate embodiment is described with reference to FIGS. 9-14. Like numerals from the first described embodiment are utilized where appropriate, with differences being indicated by 200 series numerals or with different numerals. FIG. 9, shows a processing step conducted similar to the processing steps shown in FIG. 1, except that the first photoresist mask 152 is patterned to provide the contact opening 164 in the memory cell array area 102, and not the peripheral circuitry area 104 as in FIG. 1. A directional etching process or other suitable process occurs to etch through the first insulating layer 150 as indicated by the dotted lines in FIG. 9, thus exposing poly plug 138.

Figure 10:
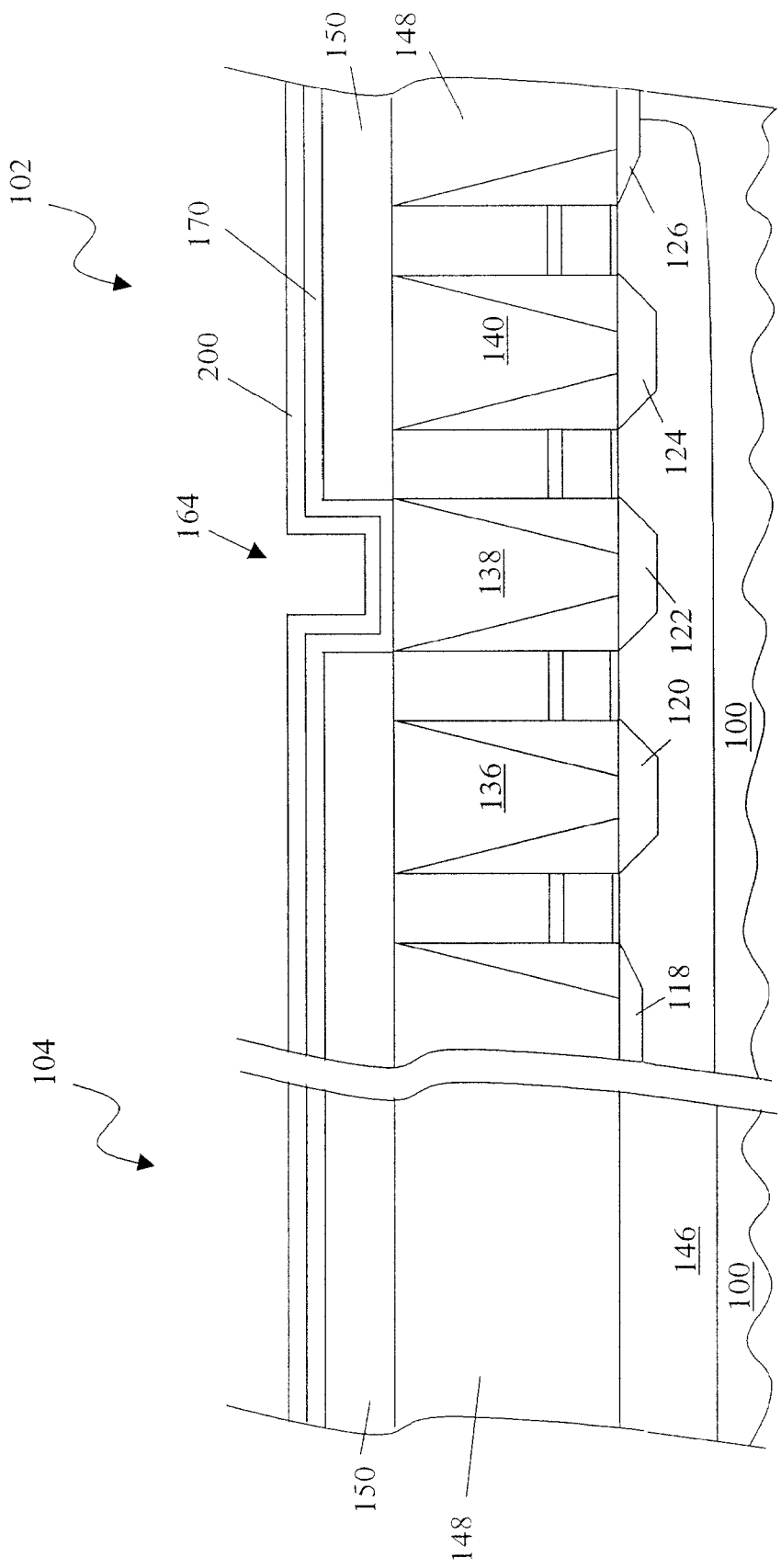
FIG. 10 shows the semiconductor device of FIG. 1 at a processing step subsequent to that shown in FIG. 9 according to an alternate embodiment of the present invention.

Referring to FIG. 10, the photoresist mask layer 152 is then removed after the etching process, and the metal mode titanium layer 170 is deposited over the memory cell array and the peripheral circuitry areas 102 and 104, respectively. The metal mode deposition is then followed by a deposition of a tungsten nitride layer 200. Accordingly, the metal mode titanium layer 170 is formed over the exposed outer surfaces of poly plug 138. Alternatively, layer 170 may comprise titanium, titanium nitride, tungsten, cobalt, molybdenum or tantalum, but any suitable metal may be used. Additionally, each layer 170, 200 may be planarized by, for example, by CMP after deposition.

Figure 11:
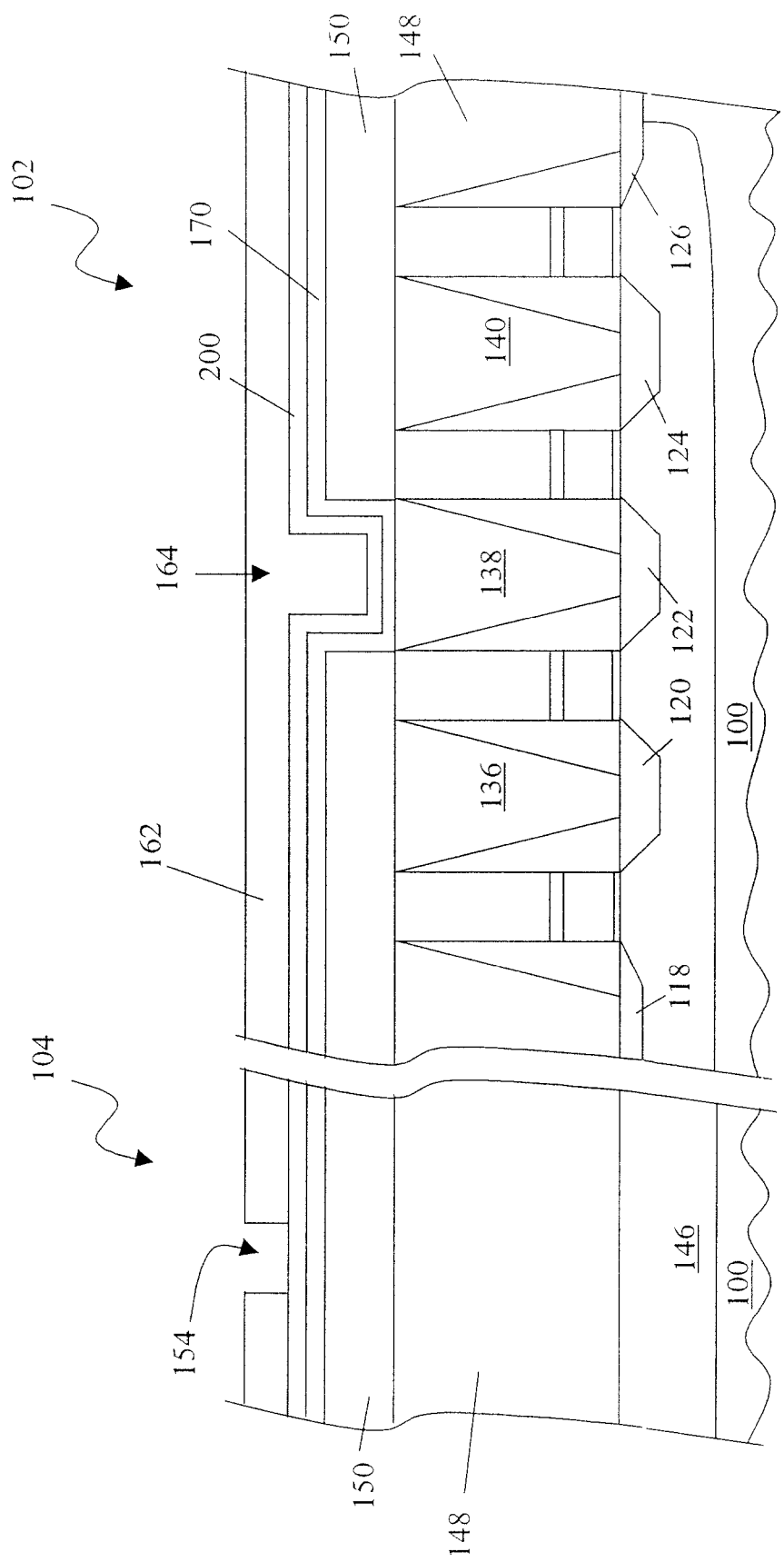
FIG. 11 shows the semiconductor device of FIG. 1 at a processing step subsequent to that shown in FIG. 10 according to an alternate embodiment of the present invention.

As shown in FIG. 11, the second photoresist layer 162 has been deposited over the substrate to fill opening 164 above the poly plug 138. The photoresist layer 162 is then patterned to form the etching opening 154 for the subsequently formed peripheral contact.

Figure 12:
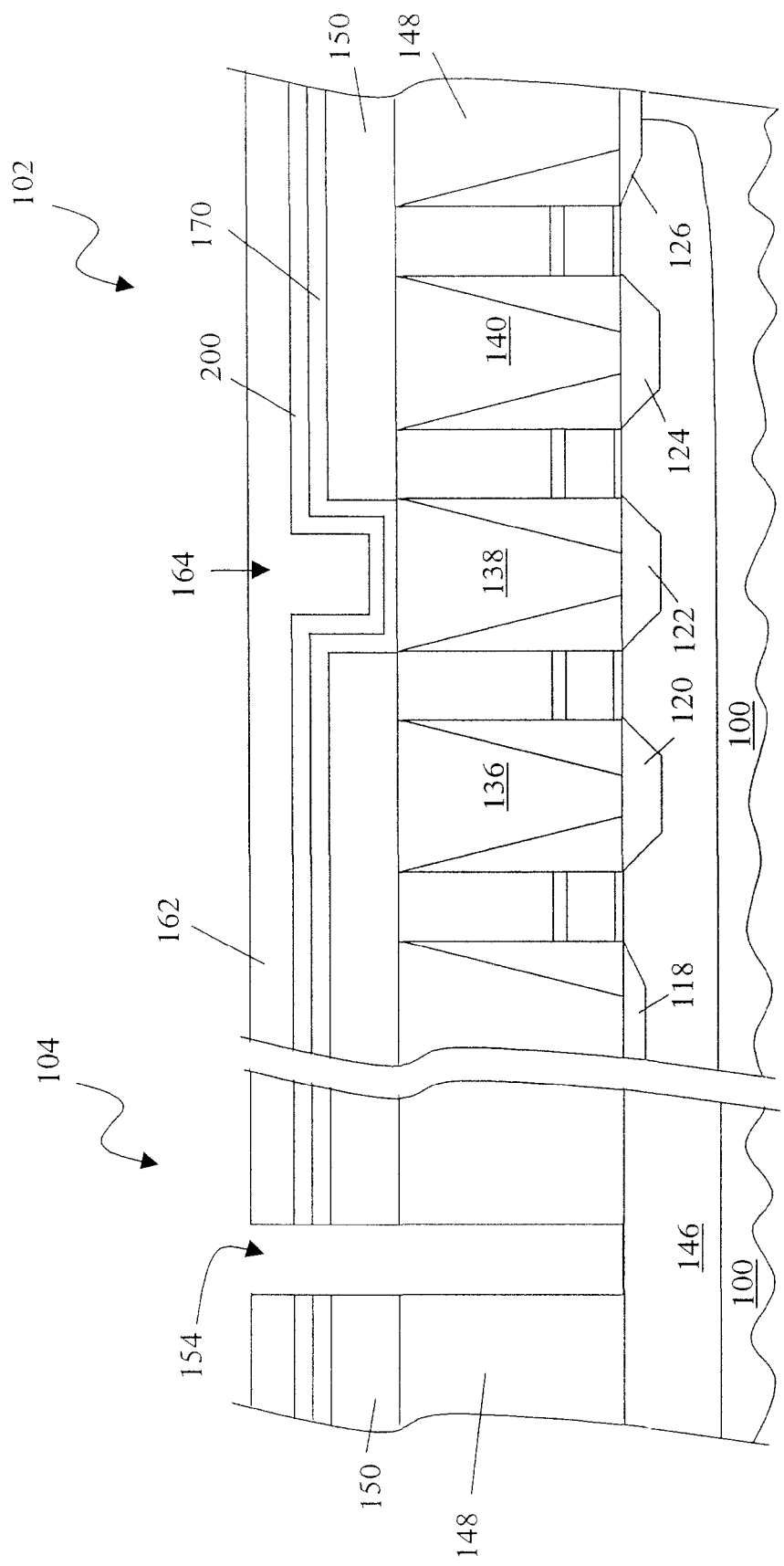
FIG. 12 shows the semiconductor device of FIG. 1 at a processing step subsequent to that shown in FIG. 11 according to an alternate embodiment of the present invention.

As shown in FIG. 12, a directional etching or other suitable etch process is performed to etch through layers 148, 150, 170, and 200 to form the contact opening 154 so as to expose a contact area in the substrate 100. It is to be appreciated that the metal mode titanium layer 170 and tungsten nitride layer 200 are used as a hard mask if needed, such that only the first and second insulating layers 148, 150 are etched after etching portions of layers 170, 200 with the directional etching process. The contact opening 154 in one embodiment is of a smaller diameter than the opening 164 above the poly plug 138.

Figure 13:
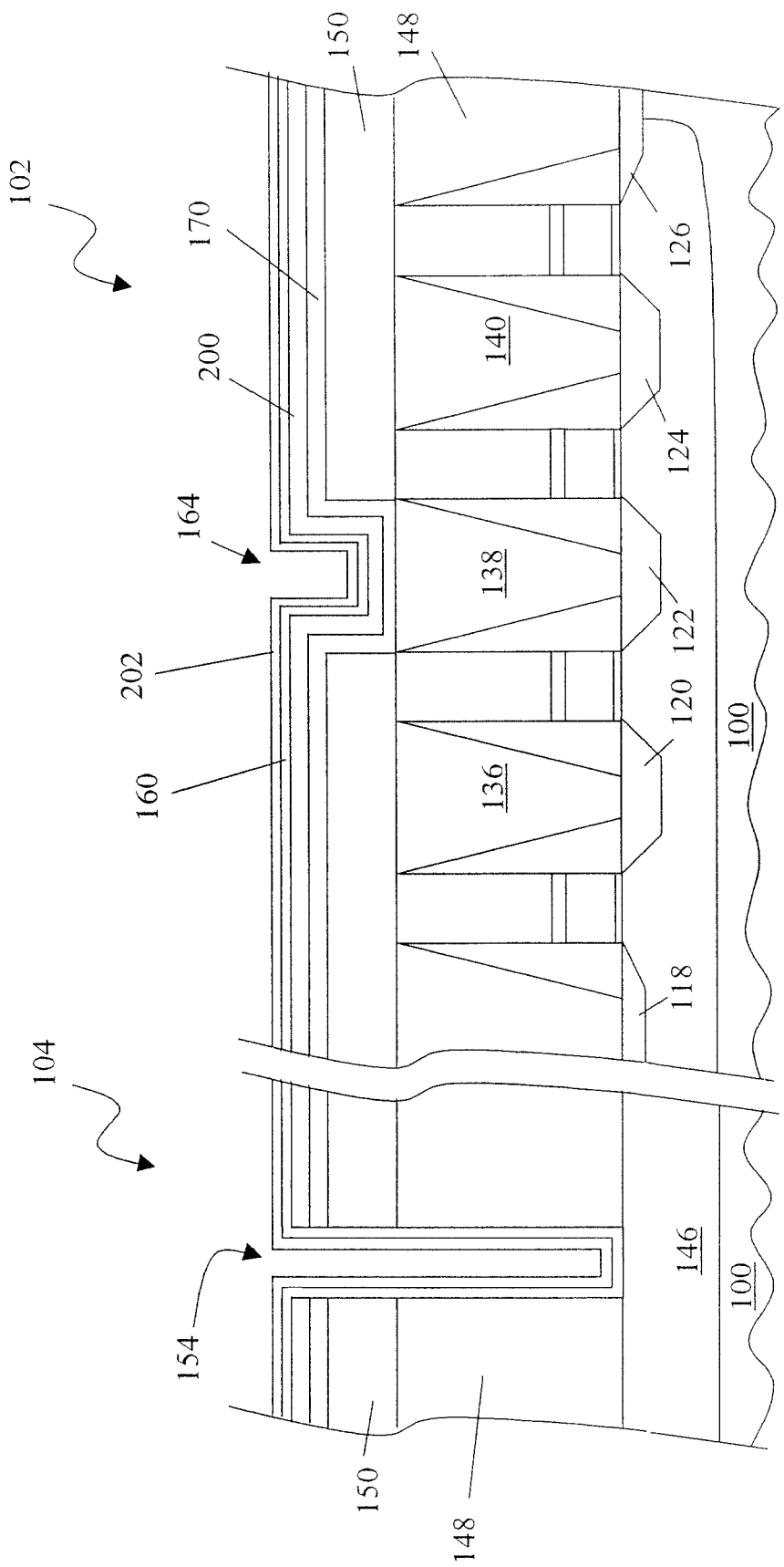
FIG. 13 shows the semiconductor device of FIG. 1 at a processing step subsequent to that shown in FIG. 12 according to an alternate embodiment of the present invention.
Figure 14:
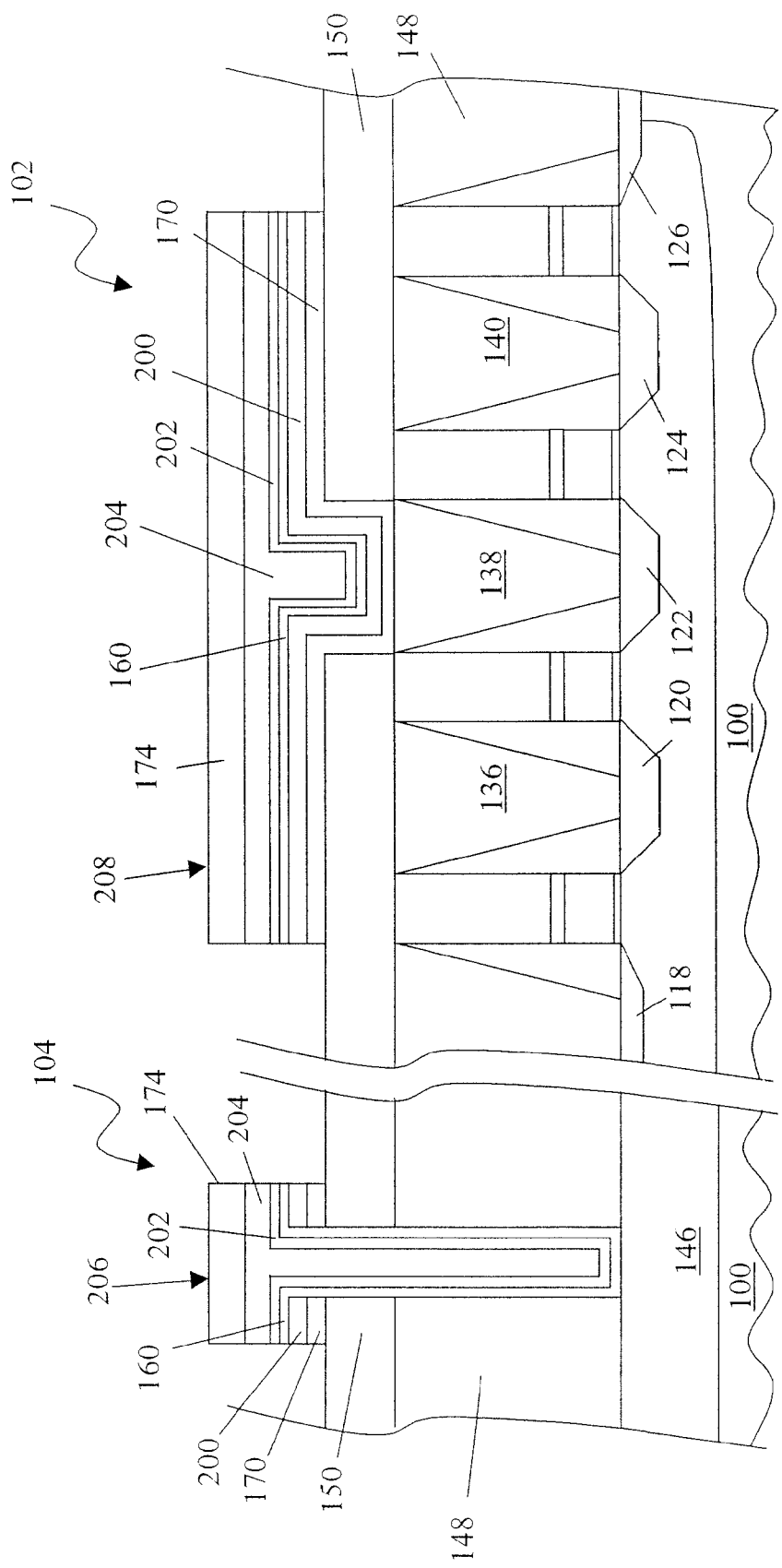
FIG. 14 shows the semiconductor device of FIG. 1 at a processing step subsequent to that shown in FIG. 13 according to an alternate embodiment of the present invention.

After formation of the peripheral contact opening 154, the second photoresist layer 162 is striped away, and the titanium layer 160 is deposited by CVD as shown by FIG. 13. As mentioned previously above, the CVD Ti layer 160 provides a low resistance periphery contact, which due to the process flow illustrated in FIGS. 9-12, does not coming into contact with the poly plug 138 in the memory cell array area 102, thus preventing voiding. An adhesion/barrier layer 202 formed from a suitable material such as titanium nitride is then deposited by CVD or other suitable deposition process. This deposition is then followed by a conductive layer 204 formed from a suitable conductive material such as tungsten or other metal to fill the contact opening 154 as illustrated by FIG. 14. The nitride capping layer 174 is then deposited and layers 174, 204, 202, 160, 200, 170 are etched and patterned so as to form contacts 206, 208 having a top portion situated on the second insulating layer 150 as also shown by FIG. 14. The contacts 206, 208 may be of any suitable size and shape so as to provide a low resistance vertical path to the active areas of the memory cell array and peripheral circuitry areas 102 and 104, respectively.

In accordance with the present invention the contacts are formed after the formation of the capacitors. In particular, the process of forming the contacts begins after the completion of all high temperature processing steps utilized in wafer fabrication and after any other temperature changes that affect the metal layers provided in the contact formation process. In one embodiment, the process begins after the heat cycles used for cell poly activation and capacitor formation. The contacts may be formed prior to forming upper cell plate contacts to the capacitor of the memory device but subsequent to high temperature processing treatment for the capacitor. Furthermore, the present invention is not limited to the illustrated layers. Any suitable number and/or arrangement of conductive and insulating layers may be used without departing from the spirit of the invention.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A memory device, comprising:
   a substrate having a memory cell array area and a peripheral circuitry area, wherein said memory cell array area comprises at least one polysilicon plug;
   an insulating layer provided over said substrate;
   at least one periphery contact defined in material layers over said substrate at said periphery circuitry area of said substrate, wherein said material layers is at least said insulating layer, said peripheral contact having a low resistance metal film layer provided over a portion of said insulating layer, along bottom and opposing sidewall edges of the periphery contact and forming metal silicide in contact with said substrate; and
   at least one memory cell array contact defined in said material layers over said substrate at said memory cell array area of said substrate, and having a metal mode film layer in direct physical contact with said at least one polysilicon plug the metal mode film layer being over and in direct contact with the low resistance metal film layer in the peripheral circuitry area; and
   a tungsten nitride layer provided on and in physical contact with said metal mode film layer such that said tungsten nitride layer inhibits formation of metal silicide on said at least one polysilicon plug.

2. A memory device as in claim 1, wherein said at least one periphery contact includes said metal mode film layer provided on said low resistance metal film layer.

3. A memory device as in claim 1, wherein said at least one periphery contact further includes said tungsten nitride layer and layers of tungsten and metal nitrides provided over said metal mode film layer.

4. A memory device as in claim 1, wherein said at least one periphery contact includes said metal mode film layer provided on said low resistance metal film layer, said further includes said tungsten nitride layer and layers of tungsten and metal nitrides provided over said metal mode film layer.

5. A memory device as in claim 1, wherein said at least one memory cell array contact further include layers of tungsten and metal nitrides provided over said tungsten nitride layer.

6. A memory device as in claim 1, wherein said metal mode film layer is provided on said low resistance metal film layer, said at least one periphery contact includes said tungsten nitride layer, and said at least one periphery contact and said at least one memory cell array contact further include layers of tungsten and metal nitrides provided over said metal mode film layer.

7. A memory device as in claim 1, wherein said low resistance metal film layer is a chemical vapor deposited metal film.

8. A memory device as in claim 1, wherein said low resistance metal film layer is chemical vapor deposited titanium.

9. A memory device as in claim 1, wherein the low resistance metal mode film has a thickness ranging from about 1 Angstrom to about 5000 Angstroms.

10. A memory device as in claim 1, wherein said low resistance metal film layer is titanium, and said metal silicide is titanium silicide (TiSix).

11. A memory device as in claim 1, wherein said metal mode film layer is physical vapor deposited titanium.

12. A memory device as in claim 1, wherein said insulating layer has a thickness ranging from about 5 Angstroms to about 10,000 Angstroms.

13. A memory device as in claim 1, wherein said low resistance metal film layer is titanium deposited by a first deposition method, and said metal mode film layer is titanium deposited by second deposition method different from said first deposition method.

14. A memory device as in claim 1, wherein said low resistance metal film layer is deposited by chemical vapor deposition, and said metal mode film layer is deposited by physical vapor deposition.

15. A memory device as in claim 1, wherein said low resistance metal film layer is titanium deposited by chemical vapor deposition, and said metal mode film layer is titanium deposited by physical vapor deposition.

16. A memory device as in claim 1, wherein said at least one memory cell array contact has a film stack.

17. A memory device as in claim 1, wherein said at least one memory cell array contact has a film stack, said metal mode film layer having a portion contacting said low resistance metal film layer.

18. A memory device as in claim 1, wherein said at least one memory cell array contact has a film stack comprising said metal mode film layer, said tungsten nitride layer, and a layer of tungsten.

19. A memory device as in claim 1, wherein said at least one memory cell array contact has a film stack comprising said metal mode film layer, said tungsten nitride layer, and a layer of tungsten, said metal mode film layer having a portion contacting said low resistance metal film layer.

20. A memory device as in claim 1, wherein said insulating layer comprises tetraethylorthosilicate (TEOS), other oxides, and combinations thereof.

21. A memory device as in claim 1, wherein said peripheral circuitry area is an N-channel transistor area, a P-channel transistor area, and combinations thereof.

22. A memory device as in claim 1, wherein said memory cell array area comprises gate stacks having an oxide layer, a conductive gate layer provided on said oxide layer, an insulating cap layer, and insulating sidewalls adjacent said at least one polysilicon plug.

23. A memory device, comprising:
   a substrate having a memory cell array area and a peripheral circuitry area, wherein said memory cell array area comprises at least one polysilicon plug;
   an insulating layer provided over said substrate;
   at least one periphery contact defined in material layers over said substrate at said periphery circuitry area of said substrate, wherein said material layers is at least said insulating layer, said peripheral contact having a low resistance metal film layer provided over a portion of said insulating layer, along bottom and sidewall edges of the periphery contact and forming metal silicide in contact with said substrate;
   at least one memory cell array contact defined in said material layers over said substrate at said memory cell array area of said substrate, and having a metal mode film layer in direct physical contact with said at least one polysilicon plug; and
   a tungsten nitride layer provided on and in physical contact with said metal mode film layer such that said tungsten nitride layer inhibits formation of metal silicide on said at least one polysilicon plug,
   wherein said at least one periphery contact includes said metal mode film layer provided on and in direct physical contact with said low resistance metal film layer, and wherein the metal mode film has a thickness ranging from about 1 Angstrom to about 5000 Angstroms and is titanium, and said metal silicide is titanium silicide (TiSix).

24. A memory device, comprising:
   a substrate having a memory cell array area and a peripheral circuitry area, wherein said memory cell array area comprises at least one polysilicon plug;
   an insulating layer provided over said substrate;
   at least one periphery contact defined in material layers over said substrate at said periphery circuitry area of said substrate, wherein said material layers is at least said insulating layer, said peripheral contact having a low resistance metal film layer provided over a portion of said insulating layer, along sidewall and bottom edges of the periphery contact and forming metal silicide in contact with said substrate;
   at least one memory cell array contact defined in said material layers over said substrate at said memory cell array area of said substrate, and having a metal mode film layer in direct physical contact with said at least one polysilicon plug;
   a tungsten nitride layer provided on and in physical contact with said metal mode film layer such that said tungsten nitride layer inhibits formation of metal silicide on said at least one polysilicon plug,
   wherein said at least one periphery contact includes said metal mode film layer provided on and in direct physical contact with said low resistance metal film layer, wherein the metal mode film has a thickness ranging from about 1 Angstrom to about 5000 Angstroms and is titanium, said metal silicide is titanium silicide (TiSix), and said at least one memory cell array contact has a film stack comprising said metal mode film layer, said tungsten nitride layer, and a layer of tungsten, said metal mode film layer having a portion contacting said low resistance metal film layer.

* * * * *

UNITED STATES PATENT AND TRADEMARK OFFICE
CERTIFICATE OF CORRECTION

| | | |
|---|---|---|
| PATENT NO. | : 7,935,997 B2 | Page 1 of 1 |
| APPLICATION NO. | : 11/612588 | |
| DATED | : May 3, 2011 | |
| INVENTOR(S) | : Terrence McDaniel | |

It is certified that error appears in the above-identified patent and that said Letters Patent is hereby corrected as shown below:

In column 8, line 12, in Claim 1, after "plug" insert -- , --.

Signed and Sealed this
Twenty-eighth Day of June, 2011

David J. Kappos
*Director of the United States Patent and Trademark Office*